United States Patent [19]

Matsushita et al.

[11] Patent Number: 4,963,457
[45] Date of Patent: Oct. 16, 1990

[54] PHOTOSENSITIVE, PRESSURE-SENSITIVE RECORDING SHEET OF PLAIN PAPER TRANSFER TYPE COMPRISING WAX

[75] Inventors: Toshihiko Matsushita; Shigetoshi Hiraishi, both of Tokyo; Sadao Morishita, Ibaraki, all of Japan

[73] Assignee: Mitsubishi Paper Mills, Ltd, Tokyo, Japan

[21] Appl. No.: 368,153

[22] Filed: Jun. 15, 1989

Related U.S. Application Data

[63] Continuation of Ser. No. 857,251, Apr. 30, 1986, abandoned.

[30] Foreign Application Priority Data

Apr. 30, 1985 [JP] Japan .................................. 60-93263
Apr. 30, 1985 [JP] Japan .................................. 60-93264
Mar. 10, 1986 [JP] Japan .................................. 61-53300

[51] Int. Cl.$^5$ ......................... G03C 1/68; G03C 1/87; G03C 5/54
[52] U.S. Cl. .................................. 430/138; 430/211; 503/200; 503/214
[58] Field of Search ................. 430/138; 503/200, 214

[56] References Cited

U.S. PATENT DOCUMENTS 4,352,855 10/1982 Hiraishi et al. ..................... 503/214
4,399,209  8/1983 Sanders et al. ..................... 430/138
4,474,898 10/1984 Matsushita et al. ................. 503/214
4,501,809  2/1985 Hiraishi et al. ..................... 430/138
4,622,282 11/1986 Head et al. .......................... 430/138
4,701,397 10/1987 Rourke et al. ....................... 430/138

FOREIGN PATENT DOCUMENTS 53-16728  6/1978 Japan .
54-126111 10/1979 Japan .
56-121790  9/1981 Japan .
57-207088 12/1982 Japan .

OTHER PUBLICATIONS

The Dictionary of Paper, Second Edition, American Paper and Pulp Association, New York, N.Y., 1951, p. 278.

Primary Examiner—Richard L. Schilling
Attorney, Agent, or Firm—Cushman, Darby & Cushman

[57] ABSTRACT

The photosensitive, pressure-sensitive recording sheet of plain paper transfer type of the present invention can be obtained by coating on a substrate, microcapsules mainly containing a photocurable resin and a reactant. This photosensitive, pressure-sensitive sheet can conduct multicolor transfer recording on a plain paper and accordingly has a very high industrial value in light of recent request for transfer recording of color manuscripts.

24 Claims, No Drawings

PHOTOSENSITIVE, PRESSURE-SENSITIVE RECORDING SHEET OF PLAIN PAPER TRANSFER TYPE COMPRISING WAX

This is a continuation of application No. 06/857,251, filed Apr. 30, 1986, which was abandoned upon the filing hereof.

BACKGROUND OF THE INVENTION

1. FIELD OF THE INVENTION

This invention relates to a photosensitive, pressure-sensitive recording sheet of plain paper transfer type.

2. PRIOR ART

Conventionally known pressure-sensitive copying papers consist of (a) an upper sheet formed by dissolving a colorless, electron-donating color former in a non-volatile oil or the like, encapsulating the resulting color former-containing oil as a core substance and coating the resulting microcapsules on one side of a substrate and (b) a lower sheet formed by coating a colorless, electron-accepting color developer on one side of a substrate. An image appears on the lower sheet when the two sheets are superimposed so that their coated sides face each other and printing is applied from the non-coated side (the up side) of the upper sheet with a pen, a typewriter or the like. Also, there are such pressure-sensitive copying papers which use, in place of the color former and the color developer both mentioned above, a metal compound and a ligand to form a chelate for color development. In actual usage of these pressure-sensitive copying papers, there is an incovenience that the upper sheet and the lower sheet must always be used in combination.

There are also pressure-sensitive copying papers of self-contained (self color development) type formed by coating on one side of a substrate both of a color-forming component and a color-developing component. When printing is applied to these papers, an image appears only on the coated side of the substrate. As well known, when a self-contained pressure-sensitive copying paper and a plain paper are superimposed so that the plain paper faces the coated side of the copying paper and printing is applied, an image appears only on the coated paper and there occurs no transfer of the image onto the plain paper.

The term "plain paper" used in the specification means a substrate containing neither reactant (e.g. electron-donating color former) nor coreactant (e.g. electron-accepting color developer), or a coated paper formed by coating a plain paper with a metal compound and/or an inorganic pigment.

Pressure-sensitive copying papers consisting of a substrate coated on one side with a color former (a reactant or a coreactant) and a color developer (a coreactant or a reactant) and capable of forming a transferred image on a plain paper are disclosed in Japanese Patent Application Kokai (Laid-open) No. 126111/1979 and Japanese Patent Publication No. 16728/1978.

Japanese Patent Application Kokai (Laid-open) No. 126111/1979 discloses that a coating color comprising a solid color former, a solid color developer and a wax is coated on a substrate in a single layer and that the coating color develops a color at the moment when the color former and the color developer are mixed. Hence, the above literature relates to a pressure-sensitive transfer material having a colored coating layer like a back carbon paper. Because of its colored coating layer, this material is disadvantageous in appearance.

Japanese Patent Publication No. 16728/1978 relates to color development by chelate. Microcapsules containing a reactant are coated on a substrate and then a solution of a coreactant in colvent is coated thereon. Since a solvent is used, the wall materials of said microcapsules must be resistant to the solvent and accordingly are restricted. This color development is disadvantageous also in environmental and economical aspects.

Pressure-sensitive copying papers having improved transferability onto a plain paper are disclosed in Japanese Patent Application Kokai (Laid-open) Nos. 121790/1981 and 207088/1982.

Japanese Patent Application Kokai (Laid-open) No. 121790/1981 discloses a plain paper transfer type pressure-sensitive copying paper obtained by coating on one side of a substrate a mixture comprising an electron-donating color former, an electron-accepting color developer and a wax. This paper is characterized by using, as the wax, a combination of two waxes, namely, an amide wax and another wax.

Japanese Patent Application Kokai (Laid-open) No. 207088/1982 discloses a plain paper transfer type pressure-sensitive copying paper obtained by coating on the back side of a substrate a ligand, a metal compound and a wax in a single layer.

These plain paper transfer type pressure-sensitive copying papers have good transferability onto a plain paper. Further, with these papers, also copying is possible as necessary by coating the whole surface or only the required parts of the substrate.

With these pressure-sensitive copying papers, however, transfer onto a plain paper is made only in a single color. That is, only one color-forming component is coated on a substrate to attain the object. Even if a plurality of color-forming components are coated, only a one mixed color is transferred.

SUMMARY OF THE INVENTION

The present inventors made an extensive study in order to enable transfer onto a plain paper in desired colors by coating a substrate in a single layer with a plurality of color-forming components. As a result, a photosensitive, pressure-sensitive recording sheet of plain paper transfer type capable of achieving the above object could be obtained.

Therefore, the present invention relates to a photosensitive, pressure-sensitive recording sheet of plain paper transfer type used in combination with a plain paper, which comprises a substrate and a photosensitive, pressure-sensitive layer formed on one side of said substrate, said layer consisting mainly of (1) microcapsules mainly containing a photocurable resin and a reactant, (2) at least one of (a) microcapsules mainly containing a photocurable resin and a coreactant, (b) microcapsules containing a coreactant and (c) a coreactant in fine powder form, all of the coreactants in (a), (b) and (c) being capable of reacting with said reactant to form a colored substance, and (3) a wax.

Further in the present invention, improved transferability and efficient recording could be attained by using a transparent or semi-transparent substrate.

Furthermore in the present invention, the higher density and improved retainability of transferred image could be attained by using a plain paper coated with a metal compound and/or an inorganic pigment. Preferable as the metal compound are an oxide, hydroxide or carbonate of a metal.

DETAILED EXPLANATION OF THE INVENTION

Microcapsules have conventionally been used in order to encapsulate a liquid or solid substance to (1) isolate it from other substance in ordinary conditions and to (2) take it out of the microcapsules whenever necessary by applying an impact to the microcapsules and breaking them, for reacting or mixing it with the other substance. Therefore, it has been inevitable that when a substrate coated with such microcapsules receives a pressure, the microcapsules of the substrate parts which have received the pressure are completely broken and the substances contained therein ooze out.

In photocurable microcapsules used in the present invention containing therein a photosensitive and photocurable resin, the breaking of microcapsules by a pressure is controlled by a light. That is, when it is desired to take out substances contained in microcapsules, a pressure is applied as in ordinary cases, to break the microcapsules and the microcapsule contents ooze out. However, when it is desired to allow the microcapsule contents to remain in the microcapsules, the microcapsules are irradiated with a light, whereby the light passing through the wall materials of the microcapsules cures the photocurable resin which is a part of the microcapsule contents and resultantly the microcapsule contents turn from a liquid to a hard resin. Consequently, the microcapsules become rigid microcapsules and, even when an outside pressure is applied, they are no longer broken, and there occurs no oozing out of the microcapsule contents. By using photocurable microcapsules having such a characteristic, the photosensitive, pressure-sensitive recording sheet of plain paper transfer type of the present invention has been made possible.

According to a preferred embodiment of the present invention, a photosensitive, pressure-sensitive layer composed essentially of (1) photocurable microcapsules containing a reactant, (2) photocurable microcapsules containing a coreactant capable of reacting with said reactant to form a colored substance and (3) a wax is formed on one side of a substrate to produce a photosensitive, pressure-sensitive recording sheet. This recording sheet and a manuscript are superimposed and exposed to a light. When the substrate of the manuscript is made from a material which easily transmits a light, particularly, ultraviolet rays, the superimposition is conducted so that the photosensitive, pressure-sensitive layer side of the recording sheet and the written, drawn or printed side (i.e. the up side) of the manuscript face each other, and a light is applied from the manuscript side. When the substrate of the manuscript does not easily transmit a light as in the case of books, etc., the superimposition is conducted so that the photosensitive, pressure-sensitive layer side of the recording sheet (in this case the substrate is transparent or semi-transparent) and the written, drawn or printed side of the manuscript face each other, and a light is applied from the recording sheet side. The light exposure time is desirably determined depending upon the combination of the recording sheet and the manuscript. The written, drawn or printed parts of the manuscript, namely, the pattern and/or letter parts absorb the light, and resultantly the corresponding parts of the recording sheet receive no light and undergo no optical change. The other parts of the manuscript transmit or reflect the light, and resultantly the corresponding parts of the recording sheet receives the light and the contents of the photocurable microcapsules present in these parts are cured. After the light exposure, the recording sheet and a plain paper are superimposed and pressed by a roll or the like, whereby (1) the microcapsules of the parts of the recording sheet corresponding to the pattern and/or letter parts of the manuscript are broken, (2) the reactant and the coreactant come in contact to produce a colored substance, and (3) a pattern and/or letters same as those of the manuscript are recorded on the plain paper as a transferred image.

As is appreciated from the above, the photosensitive, pressure-sensitive recording sheet of plain paper transfer type of the present invention enables the use of an ordinary positive type manuscript. It can be a hand-written document or a printed matter such as a book or the like. Further, since only the microcapsules of the parts of the recording sheet corresponding to the pattern and/or letter parts of the manuscript are broken to form a transferred image on a plain paper, the other parts of the plain paper cause no color change and accordingly the transferred image can be retained very stably.

The photosensitive, pressure-sensitive recording sheet of plain paper transfer type of the present invention has the following characteristics. For example, when a recording sheet is produced using microcapsules containing a photocurable resin and a reactant and microcapsules containing a photocurable resin and a coreactant, is exposed to a light together with a manuscript according to the previously mentioned manner and then is pressed together with a plain paper, clear recording is made only at the parts of the plain paper corresponding to the pattern and/or letter parts of the manuscript. Since the microcapsules in the parts of the recording sheet not corresponding to the pattern and/or letter parts of the manuscript become rigid microcapsules due to light exposure, the non-recorded parts of the plain paper, namely, the background parts cause no change. This is advantageous because the conventional problem that microcapsules containing a coreactant are broken by an applied pressure and a solution of the coreactant oozes out from the microcapsules staining the background parts can be improved.

As a further characteristic of the photosensitive, pressure-sensitive recording sheet of plain paper transfer type of the present invention, multicolor transfer recording is possible by preparing (1) a pair of microcapsule units each unit containing a reactant or a coreactant as a color-forming component and a photocurable resin or polymerization initiator and (2) another pair of microcapsule units each unit containing a coreactant or a reactant and a photocurable resin or polymerization initiator, the former photocurable resin having an absorption wave length different from that of the latter photocurable resin to control regid microcapsulation depending on the wave length of light applied to the microcapsules. In this multirecording, at least two kinds of reactants or coreactants should be employed.

Further the photosensitive, pressure-sensitive recording sheet of plain paper transfer type of the present invention makes it possible to momentarily make desired parts of the sheet desensitized using a light.

That is, the parts of the recording sheet not requiring recording are exposed to a light, prior to the use of the sheet. The photocurable microcapsules of these parts are cured. Therefore, these parts do not conduct recording when pressed for recording.

The photosensitive, pressure-sensitive recording sheet of plain paper transfer type of the present invention can be utilized also as a photosensitive, pressure-sensitive copying sheet of plain paper transfer type. The coated side of the recording sheet is superimposed on a plain paper and a pressure is applied from the non-coated side with a pen, a typewriter or the like, whereby a copied image can be obtained. This copied image formed on the plain paper due to transfer has a very high density. The high density is attributable to incorporation of a wax in the coating layer of the recording sheet. When microcapsules are broken by an applied pressure, the solvent contained in the microcapsules is absorbed by the substrate of the recording sheet reducing the transferability. However, the wax in the coating layer exhibits water- and oil-repellent effects and makes easier the transfer of the solvent onto the plain paper leading to improved transferability.

Further, the photosensitive, pressure-sensitive recording sheet of plain paper transfer type of the present invention has a characteristic of enabling multicolor transfer recording as mentioned below, by using at least two kinds of reactants or coreactants (color-forming components). For example, plural kinds of microcapsules each containing a different color-forming component and a different photocurable resin or polymerization initiator capable of absorbing a light of particular different wavelength are prepared; they are exposed to lights of different wavelengths each capable of curing only one particular kind of microcapsules; thereby a transferred image of multicolor corresponding to the number of color-forming components is formed on a plain paper. One of the above microcapsules need not contain any photocurable resin. For example, when two kinds of microcapsules are used, one kind of microcapsules contain a color-forming component and a photocurable resin and the other kind of microcapsules contain only a different color-forming component; these microcapsules are exposed to a light capable of curing said resin; thereby a transferred image of two colors is formed on a plain paper.

Further, the photosensitive, pressure-sensitive recording sheet of plain paper transfer type of the present invention has a characteristic of enabling to conduct light exposure and pressure application continuously by using a transparent or semi-transparent substrate. A recording sheet using such a substrate and a plain paper are superimposed so that the coated side of the sheet faces the plain paper; they are exposed to a light from the non-coated side of the sheet whereby only the required parts of the coating layer of the sheet are cured by the light having passed through the substrate; successively, a pressure is applied to them (the sheet and the plain paper); then, they are separated from each other; thus, a transferred image is formed on the plain paper. Hence, by using a transparent or semi-transparent substrate, three stages consisting of (a) light exposure to the sheet using a non-transparent substrate from the coated side, (b) superimposition of the sheet on a plain paper and (c) pressure application to them can be reduced to two stages.

Specific examples of the transparent or semi-transparent substrate include transparent substrates such as a polyethylene terephthalate film (a PET film), a polyvinyl chloride film, a polypropylene film, a polyethylene film, a polyimide film, cellophane and the like, as well as semi-transparent substrates such as a tracing paper and the like.

Non-transparent substrates such as a paper, an unwoven cloth, a synthetic paper, a metal foil and their composite sheets can also be used with no restriction.

Further, the photosensitive, pressure-sensitive recording sheet of plain paper transfer type of the present invention has a characteristic of being able to provide a transferred image of higher density and improved retainability when a plain paper coated with a metal compound and/or an inorganic pigment is used in combination with the recording sheet. It is because the colored substance transferred onto the plain paper causes a further reaction with the metal compound and/or the inorganic pigment. In addition, the colored substance is fixed and its retainability is improved.

As the metal compound, there can be mentioned, for example, metal oxides, metal hydroxides and metal carbonates. Preferable are zinc oxide, cadmium oxide, magnesium oxide, zinc hydroxide, magnesium hydroxide, calcium hydroxide, zinc carbonate, calcium carbonate and magnesium carbonate. Zinc oxide is particularly preferable.

As the inorganic pigment, there can be mentioned silicic acid, a aluminum silicate, zinc silicate, lead silicate, tin silicate, colloidal hydrous aluminum silicate, zeolite, bentonite, kaolin, talc, etc.

As the photocurable resin contained in photocurable microcapsules used in the present invention, there can appropriately be used photodimerizable resins having a photosensitive group (e.g. cinnamic acid residue, cinnamylidene residue, $\alpha$, $\beta$-unsaturated ketone residue, coumarin residue, anthracene residue, $\alpha$-phenylmaleimide residue, benzophenone residue, stilbene residue), photodecomposable resins having a photosensitive group (e.g. diazonium salt residue, quinone diazide residue, azide residue, dithiocarbamate residue, benzoin residue), photopolymerizable resins having an acryloyl group, an allyl group, a vinyl group, an epoxy group or the like, and so forth. Of these, photopolymerizable resins are preferable. From the convenience in use, the photocurable resin is preferably liquid. The photocurable microcapsules of the present invention can also contain the following substances as necessary. The photopolymerization initiator for polymerizing the photocurable resin contained in the photocurable microcapsules can be known compounds ordinarily used, such as a benzoin alkyl ether, benzophenone, a Michler's ketone, a thioxanthone, an acetophenone and the like. The photosensitizing aid effective for widening the sensitized wavelength range of the photopolymerization initiator can be, for example, anthraquinone, 5-nitrofluorene, etc. Further, in order to improve the storability of the recording sheet, a stabilizer (e.g. a radical polymerization initiator), a modifier, a diluent (e.g. an oligomer or monomer of relatively low molecular weight), etc. can be contained in the microcapsules. In order to increase the solubility of the reactant also contained in the microcapsules, an oily solvent of high boiling point such as an alkylnaphthalene, an alkylidenebiphenyl, an ester or the like is used as a dissolving aid. However, use of this oily solvent in a large amount is not suitable because it adversely affects the curability of the microcapsules.

The reactant and the coreactant both used in the present invention refer to reactive compounds which react with each other upon contact to form a colored substance. For example, when the colored substance is formed by a combination of a colorless, electron-donating compound and a colorless, electron-accepting compound, if the electron-donating compound is used as a reactant, the electron-accepting compound is a coreactant; conversely, if the electron-accepting compound is used as a reactant, the electron-donating compound is a coreactant. As another example of said reactive compounds, there is a combination of a ligand and a polyvalent metal compound. Specific explanation will be made on the reactive compounds. As the electron-donating compound, there can be mentioned triarylmethane type compounds such as 3,3-bis(p-dimethylaminophenyl)-6-dimethylaminophthalide, 3,3-bis(p-dimethylaminophenyl)phthalide, 3-(p-dimethylaminophenyl)-3-(1,2-dimethylindole-3-yl)phthalide and the like; diphenylmethane type compounds such as 4,4'-bisdimethylaminobenzhydrin benzyl ether and the like; xanthene type compounds such as 3-dimethylamino-7-methoxyfluoran, 3-diethylamino-7-chlorofluoran, 3-diethylamino-7-dibenzylaminofluoran and the like; thiazine type compounds such as benzoyl leucomethylene blue and the like; spiro type compounds such as 3-methylspirodinaphthopyran, 3-propyl-spirodibenzopyran and the like; and so forth.

As the electron-accepting compound, there can be mentioned inorganic acidic substances such as acid clay, active clay, kaolin, zeolite, bentonite and the like; substituted phenol type compounds such as p-cresol, p-octylphenol, p-cyclohexylphenol, p-phenylphenol, α-naphthylphenol, cumylphenol, p-chlorophenol and the like; phenolic resin type compounds such as a phenolformalin condensate, a substituted phenol-formalin condensate and the like; metal salt-modified phenolic resin type compounds obtained by modifying a phenolic resin type compound with a polyvalent metal such as zinc, nickel or the like; aromatic carboxylic acid type compounds such as p-butylbenzoic acid, p-hydroxybenzoic acid, 2,5-dihydroxybenzoic acid, salicylic acid, 5-tertbutylsalicylic acid, 3,5-di-tert-butylsalicylic acid, 3,5-di(α-methylbenzyl)salicylic acid and the like; polyvalent metal (zinc, nickel or the like) salts of aromatic carboxylic acid type compounds; mixtures between an aromatic carboxylic acid type compound and a polyvalent metal compound (e.g. zinc acetate, zinc propionate); and so forth.

As the ligand and the polyvalent metal compound of the present invention, there can be mentioned water-soluble, chelate-forming substances mentioned in Japanese Patent Publication No. 23710/1968, for example, tannic acid and ammonium metavanadate, tannic acid and iron alum, naphthol AS sodium hydroxide and stable diazonium salt of 4-benzoamide-2,5-diethoxyaniline, and phthalonitrile and copper sulfate. There can also be mentioned oil-soluble, chelate-forming substances; for example; sodium orthovanadate, sodium metavanadate or the like and an aromatic hydroxy compound (e.g. protocatechuic acid, ethyl protocatechuate, gallic acid, ethyl gallate, dodecyl gallate, pyrogallol-4-carboxylic acid, pyrogallol tannin, tannic acid), mentioned in Japanese Patent Publication No. 17889/1975; combinations disclosed in Japanese Patent Publication No. 43566/1974 of iron (II) naphthenate and zinc o,o-diisopropyldithiophosphate, of iron stearate and zinc dimethyldithiocarbamate, of copper palmitate and N,N'-bis-2-octanoyloxyethyldiethyldithiooxamide, and of cobalt naphthenate and N-lauroyl-DL-glutamic acid; and a combination of a vanadium salt (e.g. vanadyl acetate, vanadium acetyl acetonate, vanadyl acetylacetonate) and a gallic acid ester (e.g. n-propyl gallate, n-butyl gallate, n-octyl gallate), an alkylcatechol (e.g. 4-tert-butylcatechol, 3,5-di-tert-butylcatechol, 3,6-diisopropylcatechol), a thiocatechol [e.g. 2,3-dihydroxynaphthalene, 2,3,4-trihydroxyacetophenone, pyrogallol, 2,2'-thiobis(p-cresol)], or a halogenated catechol (e.g. quercetin, tetrachlorocatechol, tetrabromocatechol), mentioned in Japanese Patent Publication No. 6926/1979.

As the wax of the present invention, there can be mentioned animal waxes such as beeswax, spermaceti wax, chinese insect wax, lanolin and the like; vegetable waxes such as candelilla wax, carnauba wax, Japan wax, rice wax, cane wax and the like; mineral waxes such as montan wax, ozokerite, ceresine, lignite wax and the like; petroleum waxes such as paraffin wax, microcrystalline wax and the like; modified waxes such as a montan wax derivative, a paraffin wax derivative, a microcrystalline wax derivative and the like; hydrogenated waxes such as castor wax, opal wax and the like; synthetic waxes such as a low molecular weight polyethylene, its derivative, acra wax, distearyl ketone and the like; fatty acid amide waxes such as caproamide, caprylamide, pelargoamide, capramide, lauramide, dodecylamide, myristamide, stearamide, behenamide, ethylenebisstearamide and the like; and unsaturated fatty acid amide waxes such as caproleamide, myristoleamide, oleamide, elaidamide, linoleamide, erucamide, ricinoleamide, linolenamide and the like. These waxes can be used singly or in combination.

The microcapsules used in the present invention can be produced according to a method known in the industry. They can be produced according to, for example, (1) the phase separation method using an aqueous solution as mentioned in U.S. Pat. Nos. 2800457, 2800458, etc., (2) the interfacial polymerization method as mentioned in Japanese Patent Publication Nos. 19574/1963, 446/1967, 771/1967, etc., (3) the in-situ method by monomer polymerization as mentioned in Japanese Patent Publication No. 9168/1961, Japanese Patent Application Kokai (laid-open) No. 9079/1976, etc., (4) the melting-dispersion-cooling method as mentioned in UK Patent Nos. 952807, 965074, etc., and (5) the spray drying method as mentioned in U.S. Pat. No. 3111407, UK Patent No. 30422, etc. However, the production is not restricted to these methods. As the wall film-forming materials for the microcapsules, there can be used gelatin, gum arabic, starch, sodium alginate, ethyl cellulose, carboxyethyl cellulose, a polyvinyl alcohol, a polyethylene, a polyamide, a polyester, a polyurethane, a polyethyleneimine, etc. Particularly preferable are those materials capable of sufficiently transmitting a light, particularly, ultraviolet rays.

As the light for curing the photocurable microcapsules used in the present invention, ultraviolet rays are generally used. As the light source, there are used sunlight, a xenon lamp, a low or high pressure mercury lamp, a fluorescent lamp, etc. A weak light such as an indoor light, indirect sunlight or the like does not substantially reduce the characteristics of the photosensitive, pressure-sensitive recording sheet of the present invention during its production or ordinary handling.

In the photosensitive, pressure-sensitive recording sheet of plain paper transfer type of the present invention, a water-soluble binder or a latex is generally used in the photosensitive, pressure-sensitive layer to allow the substrate to hold the layer. For example, there are used gelatin, casein, carboxymethyl cellulose, hydroxymethyl cellulose, oxidized starch, esterified starch, a polyvinyl alcohol, a polyvinyl pyrrolidone, a polyacrylic acid, a vinyl acetate-acrylic acid copolymer, an acrylonitrile-butadiene copolymer, a vinylidene chloride type copolymer and the like, as a water-soluble high molecular compound or a latex. They are selected from the standpoints of film strength, dispersibility, etc. and are used singly or in combination.

To the photosensitive, pressure-sensitive layer of the photosensitive, pressure-sensitive recording sheet of plain paper transfer type of the present invention can further be added a capsule-protecting agent such as a cellulose powder, starch particles, plastic particles and or the like; an inorganic pigment such as talc, calcium carbonate, zinc oxide, titanium oxide or the like; an organic pigment such as an urea-formalin resin or the like; a dispersing agent; a defoamant; and so forth.

The photosensitive, pressure-sensitive layer can be formed, for example, by coating the whole area of one side of the substrate using an air knife coater, a blade coater, a gravure coater or the like, or by coating the particular areas of one side of the substrate using a flexographic printing machine, a gravure printing machine or the like.

The photosensitive, pressure-sensitive recording sheet of plain paper transfer type of the present invention comprises a substrate and a photosensitive, pressure-sensitive layer formed on one side of said substrate, said layer consisting mainly of (1) microcapsules mainly containing a photocurable resin and a reactant, (2) at least one of (a) microcapsules mainly containing a photocurable resin and a coreactant, (b) microcapsules containing a coreactant and (c) a coreactant in fine powder form, all of the coreactants in (a), (b) and (c) being capable of reacting with said reactant to form a colored substance, and (3) a wax, and is characterized by being capable of conducting transfer recording, particularly, multicolor transfer recording on a plain paper.

Conventional pressure-sensitive copying papers coated with a plurality of microcapsules each containing a different reactant but no photocurable resin can conduct transfer recording of only one mixed color. In the recording sheet of the present invention, however, the presence of a photocurable resin in microcapsules together with a reactant or coreactant converts the microcapsules into rigid microcapsules upon light exposure, whereby the breaking of the microcapsules can be controlled and transfer recording in desired colors is made possible.

Further in the recording sheet of the present invention, operational stages from light exposure to pressure application can be simplified by employing a transparent or semi-transparent substrate.

Furthermore in the recording sheet of the present invention, the density of transferred image can be enhanced by using a plain paper coated with a metal compound and/or an inorganic pigment.

The present invention will be explained specifically below by way of Examples. Parts in the Examples refer to parts by weight.

EXAMPLE 1

(1) Photocurable microcapsules containing a reactant were prepared as follows.

100 parts of an aqueous solution containing 10% of an ethylene-maleic anhydride copolymer, 10 parts of urea, 1 part of resorcin and 200 parts of water were mixed to form an aqueous solution. This solution was adjusted to pH 3.5 using an aqueous sodium hydroxide solution. In the solution was dispersed 172.8 parts of an epoxy acrylate type photocurable resin (brand name: RIPOXY, manufactured by Showa Highpolymer Co., Ltd.) containing 7.2 parts of an electron-donating compound as a reactant, namely, 3-diethylamino-6-methyl-7-anilinofluoran and 0.5 part of benzoin ethyl ether to produce an oil-in-water type emulsion having an oil droplet diameter of 4 to 8 $\mu$. Then, 25 parts of a 37% aqueous formaldehyde solution was added thereto. The whole mixture was stirred at 55° C. for 4 hours and cooled to room temperature, whereby microcapsule preparation was completed.

(2) Photocurable microcapsules containing a coreactant were prepared as follows.

Microcapsule preparation was conducted in the same manner as in the above (1) except that 3-diethylamino-6-methyl-7-anilinofluoran used in the above (1) was replaced by an electron-accepting compound as a coreactant, namely, 9.0 parts of 3,5-di-tert-butylsalicylic acid and 11.5 parts of zinc octylate (brand name: Octhix Zn, manufactured by Nihon Kagaku Sangyo Co., Ltd.).

(3) A coating color having the following formulation was prepared and coated on one side of a paper weighing 50 g/m$^2$ using a Meyer bar to produce a photosensitive, pressure-sensitive recording sheet of plain paper transfer type.

| Microcapsules containing a reactant | 10 parts |
| Microcapsules containing a coreactant | 20 parts |
| Paraffin wax | 10 parts |
| Wheat starch | 20 parts |
| SBR latex | 10 parts |

This recording sheet and a manuscript (s semitransparent paper whose one side is hand-written) were superimposed so that the coated side of the former and the hand-written side of the latter faced each other, and a xenon light was applied to them from the manuscript side using Riso Xenofax FX-150. Then, the recording sheet and a plain paper were superimposed and passed between rubber rolls to apply a pressure to them. The same letters as those on the manuscript appeared on the plain paper as a transfer image of black color. The parts of the plain paper other than the letter parts caused no color change and retained the original white color.

Separately, the above coating color was coated on one side of a polyethylene terephthalate film of 50 $\mu$m in thickness. The resulting recording sheet was superimposed on a plain paper so that the coated side of the former faced the plain paper. Then, the back side of a manuscript was superimposed on the non-coated side of the recording sheet. In the same manner as above, a xenon light was applied to them and, after the manuscript had been removed, the recording sheet and the plain paper were passed between rubber rolls to apply a pressure to them. As a result, a transfer image could be formed on the plain paper. Thus, by using a preliminarily set combination of a recording sheet using a transparent substrate and a plain paper, light application through a manuscript and pressure application could be conducted continuously and were simplified compared with a case of using a recording sheet using a paper as a substrate.

EXAMPLE 2

(1) Photocurable microcapsules containing a ligand as a reactant were prepared as follows.

To 100 parts of an aqueous solution of pH 4.0 containing 5% of a styrene-maleic anhydride copolymer and a small amount of sodium hydroxide was added a mixed solution consisting of 10 parts of dodecyl gallate, 30 parts of a polyoxypropylene glycol monoether, 0.3 part of benzoin ethyl ether and 59.7 parts of an epoxyacrylate type photocurable resin (brand name: RIPOXY, manufactured by Showa Highpolymer Co., Ltd.), to prepare an emulsion. 10 parts of melamine, 25 parts of a 37% aqueous formaldehyde solution and 65 parts of water were adjusted to pH 9 using sodium hydroxide and, upon heating to 60° C., they became transparent in 15 minutes, whereby a melamineformaldehyde precondensate was obtained. This precondensate was added to the emulsion prepared above, and they were stirred continuously at 60° C. In 30 minutes, the formation of microcapsules was confirmed and the fluid was cooled to room temperature.

(2) Photocurable microcapsules containing a coreactant were prepared as follows.

Microcapsule production was conducted in the same manner as in the above (1) except that 10 parts of dodecyl gallate was replaced by 8 parts of vanadosiloxane and further 30 parts of the polyoxypropylene glycol monoether was replaced by 80 parts of dioctyl phthalate.

(3) A coating color having the following formulation was prepared using the microcapsules prepared in the above (1) and (2).

| | |
|---|---|
| Photocurable microcapsules containing dodecyl gallate | 35 parts |
| Photocurable microcapsules containing vanadosiloxane | 15 parts |
| Paraffin wax | 15 parts |
| Wheat starch | 20 parts |
| SBR latex | 15 parts |

The above parts are parts by weight of dry solid. This coating color was coated on a paper weighing 50 g/m² using a Meyer bar to produce a photosensitive, pressure-sensitive recording sheet of plain paper transfer type.

In the same manner as in Example 1, the recording sheet was subjected to light exposure and pressure application to conduct transfer recording, whereby a black transfer image was formed on a plain paper.

The above coating color was also coated on a polyethylene terephthalate film of 50 μm in thickness. Then, in the same manner as in Example 1, a transfer image was formed on a plain paper. Light application and pressure application could be simplified compared with the above case of using a paper as the substrate of the recording sheet.

EXAMPLE 3

(1) Preparation of photocurable microcapsules containing a reactant (a colorless dye capable of forming a black color)

Microcapsule preparation was conducted in the same manner as in Example 1 (1) except that benzoin ethyl ether as a photopolymerization initiator was replaced by a photopolymerization initiator having a γ max at around 300 nm.

(2) Preparation of photocurable microcapsules containing a reactant (a colorless due capable of forming a red color)

Microcapsule preparation was conducted in the same manner as in Example 1 (1) except that benzoin ethyl ether as a photopolymerization initiator was replaced by a photopolymerization initiator having a γ max at around 400 nm and further 3-diethylamino-6-methyl-7-anilinofluoran was replaced by 3-diethylamino-7-chlorofluoran.

(3) Preparation of photocurable microcapsules containing a coreactant

Microcapsule preparation was conducted in the same manner as in Example 1 (1) except that 3-diethylamino-6-methyl-7-anilinofluoran was replaced by an electron-accepting compound as a coreactant, namely, 9.0 parts of 3,5-di-tert-butylsalicylic acid and 11.5 parts of zinc octylate (brand name: Octhix Zn, manufactured by Nihon Kagaku Sangyo Co., Ltd.) and further benzoin ethyl ether as a photopolymerization initiator was replaced by a photopolymerization initiator having a γ max at around 300 nm.

(4) Preparation of photocurable microcapsules containing a coreactant

Microcapsule preparation was conducted in the same manner as in the above (3) except that the photopolymerization having a γ max at around 300 nm was replaced by a photopolymerization initiator having a γ max at around 400 nm.

(5) A coating color having the following formulation was prepared and coated on a paper weighing 50 g/m² using a Meyer bar to prepare a photosensitive, pressure-sensitive recording sheet of plain paper transfer type.

| | |
|---|---|
| Photocurable microcapsules containing a reactant, prepared in the above (1) | 10 parts |
| Photocurable microcapsules containing a reactant, prepared in the above (2) | 10 parts |
| Photocurable microcapsules containing a coreactant, prepared in the above (3) | 20 parts |
| Photocurable microcapsules containing a coreactant, prepared in the above (4) | 20 parts |
| Paraffin wax | 20 parts |
| Wheat starch | 40 parts |

Using the above recording sheet, transfer recording in two colors of black and red was conducted as follows.

The above recording sheet and a manuscript 1 consisting of a semi-transparent sheet were superimposed so that the coated side of the former and the up side of the latter faced each other. A light of around 400 nm was applied to them from the manuscript 1 side using a light filter.

The photocurable microcapsules prepared in the above (2) and (4) which are sensitive to wavelengths around 400 nm became rigid microcapsules at the parts of the recording sheet corresponding to the background parts of the manuscript 1. After this light application, the unexposed parts of the recording sheet retained a capability of color development in red and black colors. Subsequently, the recording sheet and a manuscript 2 consisting of a semi-transparent sheet were superimposed so that the coated side of the recording sheet and the up side of the manuscript 2 faced each other. In this case, it is necessary that the manuscript 2 be made so as to allow formation of a black image. A light of around 300 nm was applied to them from the manuscript 2 side using a light filter.

The photocurable microcapsules prepared in the above (1) and (3) which are sensitive to wavelengths around 300 nm became rigid microcapsules, at the parts of the recording sheet exposed to the light through the manuscript 2. As a result of these two times light application, the respecitve unexposed parts of the recording sheet retained photocurable microcapsules containing a reactant (black) and photocurable microcapsules containing a coreactant capable of reacting with said reactant to form a black color, and photocurable microcapsules containing a reactant (red) and photocurable microcapsules containing a coreactant capable of reacting with said reactant to form a red color.

Subsequently, the recording sheet and a plain paper were superimposed and passed through rubber rolls for pressure application, whereby a transfer image in two colors of black and red could be formed on the plain paper.

EXAMPLE 4

(1) Photocurable microcapsules containing a reactant were prepared as follows.

100 parts of an aqueous solution containing 10% of an ethylene-maleic anhydride copolymer, 10 parts of urea, 1 part of resorcin and 200 parts of water were mixed and made into a solution. This solution was adjusted to pH 3.5 with sodium hydroxide. In the solution was dispersed 172.8 parts of an epoxy acrylate type photocurable resin (brand name: RIPOXY, manufactured by Showa Highpolymer Co., Ltd.) containing 7.2 parts of an electron-donating compound as a reactant, namely, 3-diethylamino-6-methyl-7-anilinofluoran and 0.5 part of benzoin ethyl ether, to prepare an oil-in-water type emulsion having oil droplets of 4 to 8 $\mu$ in diameter. Thereto was added 25 parts of a 37% aqueous formaldehyde solution. The mixture was stirred at 55° C. for 4 hours and cooled to room temperature, whereby microcapsules were prepared.

(2) Microcapsules containing a coreactant were prepared as follows.

Microcapsule preparation was conducted in the same manner as in the above (1) except that 3-diethyl-6-methyl-7-anilinofluoran, benzoin ethyl ether and the epoxy acrylate type photocurable resin were replaced by an electron-accepting compound as a coreactant, namely, 35 parts of a p-phenylphenol resin and 53 parts of 1,1-diphenylethane.

(3) A coating color having the following formulation was prepared and coated on a paper of 50 g/m$^2$ using a Meyer bar, to prepare a photosensitive, pressure-sensitive recording sheet of plain paper transfer type.

| Photocurable microcapsules containing a reactant | 10 parts |
| --- | --- |
| Microcapsules containing a coreactant | 20 parts |
| Paraffin wax | 10 parts |
| Wheat starch | 20 parts |
| SBR latex | 10 parts |

The recording sheet and a manuscript (a semi-transparent paper hand-written on one side) were superimposed so that the coated side of the former and the hand-written side of the latter faced each other. A xenon light was applied to them from the manuscript side using Riso Xenofax FX-150. Then, the recording sheet and a plain paper were superimposed so that the coated side of the former faced the plain paper, and they were passed between rubber rolls to apply a pressure, whereby a black transfer image of the same letters as on the manuscript was formed on the plain paper. The parts of the plain paper other than the letters caused no color change and kept the original white color.

When a polyethylene terephthalate film of 50 $\mu$m in thickness was used in place of the paper of 50 g/m$^2$, light application and pressure application could be simplified as in Example 1.

EXAMPLE 5

(1) Photocurable microcapsules containing a ligand as a reactant were prepared as follows.

To 100 parts of an aqueous solution of pH 4.0 containing 5% of a styrene-maleic anhydride copolymer and a small amount of sodium hydroxide was added a mixed solution consisting of 10 parts of dodecyl gallate, 30 parts of a polyoxypropylene glycol monoether, 0.3 part of benzoin ethyl ether and 59.7 parts of an epoxy acrylate type photocurable resin (brand name: RIPOXY, manufactured by Showa Highpolymer Co., Ltd.), and they were emulsified. 10 parts of melamine, 25 parts of a 37% aqueous formaldehyde solution and 65 parts of water were adjusted to pH 9 with sodium hydroxide and then heated to 60° C. In 15 minutes, the mixture became transparent and a melamine-formaldehyde precondensate was obtained. This precondensate was added to the emulsion prepared previously. The resulting mixture was continuously stirred at 60° C. The formation of microcapsules was confirmed in 30 minutes and the microcapsule fluid was cooled to room temperature.

(2) Microcapsules containing a coreactant were prepared as follows.

Microcapsule preparation was conducted in the same manner as in the above (1) except that 10 parts of dodecyl gallate and 30 parts of the polyoxypropylene glycol monoether were replaced by 8 parts of vanadosiloxane and 80 parts of dioctyl phthalate, respectively, and benzoin ethyl ether and the epoxy acrylate type photocurable resin were not used.

(3) A coating color having the following formulation was prepared using the microcapsules prepared in the above (1) and (2).

| Photocurable microcapsules containing dodecyl gallate | 35 parts |
| --- | --- |
| Microcapsules containing vanadosiloxane | 15 parts |
| Paraffin wax | 15 parts |
| Wheat starch | 20 parts |
| SBR latex | 15 parts |

The above parts are parts by weight of dry solid. This coating color was coated on a paper of 50 g/m$^2$ using a Meyer bar, to produce a photosensitive, pressure-sensitive recording sheet of plain paper transfer type.

The recording sheet was subjected to light exposure and pressure application in the same manner as in Example 1 to conduct transfer recording, whereby a black transfer image was formed on a plain paper.

When a polyethylene terephthalate film of 50 $\mu$m in thickness was used in place of the paper of 50 g/m$^2$, light application and pressure application could be simplified as in Example 1.

EXAMPLE 6

(1) Preparation of photocurable microcapsules containing a reactant

Microcapsule preparation was conducted in the same manner as in Example 1 (1) except that 3-diethylamino-6-methyl-7-anilinofluoran was replaced by Crystal Violet Lactone (blue).

(2) Preparation of microcapsules containing a reactant

Microcapsule preparation was conducted in the same manner as in Example 2 (2) except that 8 parts of vanadosiloxane and 80 parts of dioctylphthalate were replaced by 8 parts of 3-diethylamino-7-chlorofluoran and 80 parts of 1,1-diphenylethane.

(3) Preparation of microcapsules containing a co-reactant

Microcapsule preparation was conducted in the same manner as in the above (2) except that 8 parts of 3-diethylamino-7-chlorofluoran and 80 parts of 1,1-diphenylethane were replaced by 35 parts of a p-phenylphenol resin and 53 parts of 1,1-diphenylethane.

(4) A coating color having the following formulation was prepared and coated on a paper of 50 g/m$^2$ using a Meyer bar, to produce a photosensitive, pressure-sensitive recording sheet of plain paper transfer type.

| | |
|---|---|
| Photocurable microcapsules prepared in the above (1) | 10 parts |
| Microcapsules prepared in the above (2) | 10 parts |
| Microcapsules prepared in the above (3) | 20 parts |
| Parafin wax | 15 parts |
| Wheat starch | 25 parts |
| SBR latex | 15 parts |

The recording sheet and a manuscript (a semi-transparent sheet having on one side a printed polka-dotted pattern) were superimposed so that the coated side of the former and the pattern side of the latter faced each other. A xenon light was applied to them from the manuscript side using Riso Xenofax FX-150. Then, the recording sheet and a plain paper were superimposed so that the coated side of the former faced the latter, and they were passed between rubber rolls to apply a pressure, whereby a violet, polka-dotted pattern with a red background was formed as a transfer image on the plain paper.

EXAMPLE 7

(1) Preparation of coated plain papers

To a solution obtained by dissolving 4.5 parts of sodium pyrophosphate as a dispersing agent in 95.5 parts of water was added, with stirring, 150 parts of one of the metal compounds and inorganic pigments shown in Table, and they were dispersed thoroughly. To the resulting dispersion being stirred was slowly added 200 parts of a 10% polyvinyl alcohol. In the same manner, 20 parts of a 50% SBR latex was added. The resulting coating color was coated on a wood-free paper of 40 g/m$^2$ using a Meyer bar so that the coated amount became 6 g/m$^2$ (as solid).

(2) Preparation of photosensitive, pressure-sensitive recording sheets of plain paper transfer type In the same manner as in Example 1, Example 2 or Example 4, coating was made on a polyethylene terephthalate film of 50 μm in thickness using a Meyer bar so that the coated amount became 10 g/m$^2$, whereby various photosensitive, pressure-sensitive recording sheets of plain paper transfer type were prepared.

(3) Printing and evaluation

One of the recorded sheets prepared in the above (2) and one of the coated plain papers prepared in the above (1) were superimposed so that their coated sides faced each other. A solid manuscript was placed on the non-coated side of the recording sheet and a xenon light was applied to them from the manuscript side using Riso Xenofax FX-150. The manuscript was removed, and the recording sheet and the coated plain paper were passed through a supercalender to apply a pressure of 10 kg/cm$^2$. Since the parts of the recording sheet corresponding to the solid parts of the manuscript had been protected from the xenon light and the microcapsules in these parts had remained uncured, a solid transfer image was formed on the coated plain paper by the pressure application.

The transfer image was subjected to measurement by an optical densitometer (Macbeth RD 514). Further, in order to examine the retainability, the transfer image was subjected to a light resistance test wherein the transfer image was exposed to a light at 40° C. for 3 hours in an atmosphere of 60% RH using a xenon long life fadeometer.

The results are shown in Table as an optical density and a retention percentage. The results on the wood-free paper used in the above (1) are also shown for comparison.

TABLE

| Material coated on plain paper | Recorded sheet of Example 1 | | Recorded sheet of Example 2 | | Recorded sheet of Example 4 | |
|---|---|---|---|---|---|---|
| | Optical density | Retention percentage | Optical density | Retention percentage | Optical density | Retention percentage |
| Zinc oxide | 0.82 | 91 | 0.76 | 86 | 0.67 | 88 |
| Calcium carbonate | 0.71 | 82 | 0.75 | 78 | 0.63 | 82 |
| Kaolin | 0.75 | 86 | 0.71 | 81 | 0.65 | 85 |
| Zinc silicate | 0.77 | 88 | 0.73 | 84 | 0.66 | 87 |
| Wood-free paper* | 0.38 | 74 | 0.40 | 76 | 0.31 | 65 |

*This was used as an image-receiving paper.

As is obvious from the Table, when a plain paper coated with a metal compound or an inorganic pigment is used as an image-receiving paper, both the density and the retention percentage are high as compared with when a wood-free paper is used.

The photosensitive, pressure-sensitive recording sheet of plain paper transfer type of the present invention consisting of (1) a substrate and (2) a photosensitive, pressure-sensitive layer formed on one side of said substrate and comprising plural kinds of microcapsules each mainly containing a photocurable resin and a reactant can conduct multicolor transfer recording. Accordingly, the recording sheet has a very high industrial value in light of a recent request for transfer recording of color manuscripts.

What is claimed is:

1. A plain paper type transfer imaging system comprising a photosensitive, pressure-sensitive recording sheet and a plain paper coated with at least one of a metal compound and an inorganic pigment, wherein said recording sheet comprises a transparent or semi-transparent substrate and a photosensitive, pressure-sensitive layer formed on one side of said substrate and said photosensitive, pressure-sensitive layer is one consisting essentially of (1) microcapsules containing a photocurable resin and a reactant, (2) at least one of (a) microcapsules containing a photocurable resin and a coreactant, (b) microcapsules containing a coreactant and (c) a coreactant in fine powder form, wherein all of the coreactants in (a), (b) and (c) are capable of reacting with said reactant to form a colored substance, and (3) a wax, whereby the photocurable resin in the microcapsules converts the microcapsules into rigid microcapsules upon light exposure, thereby controlling breakage of the microcapsules and thereby making it possible to conduct transfer recording.

2. The plain paper type transfer imaging system according to claim 1, wherein the reactant is an electron-donating compound and the coreactant is an electron-accepting compound or vice versa.

3. The plain paper type transfer imaging system according to claim 2, wherein the electron-donating compound is a triarylmethane compound, a diphenylmethane compound, a xanthene compound, a thiazine compound, or a spiro compound, and the electron-accepting compound is an inorganic acidic substance, a substituted phenol compound, a phenolic resin compound, a metal salt-modified phenolic resin compound, an aromatic carboxylic acid compound, a polyvalent metal salt of an aromatic carboxylic acid compound, or a mixture of an aromatic carboxylic acid compound and a polyvalent metal compound.

4. The plain paper type transfer imaging system according to claim 3, wherein the metal compound is a member selected from the group consisting of a metal oxide, a metal hydroxide or a metal carbonate.

5. The plain paper type transfer imaging system according to claim 1, wherein said microcapsules are of more than one kind of microcapsule, with each kind of microcapsule containing a different color-forming component and a different photocurable resin or polymerization initiator capable of absorbing a light of particular wavelength, whereby a transferred multicolor image corresponding to the number of color-forming components on the plain paper is formed upon exposure of the microcapsules to lights of different wavelength, each capable of curing only one particular kind of microcapsule.

6. A process for forming a transfer image on a plain paper coated with at least one of a metal compound and an inorganic pigment, using a recording sheet comprising a transparent or semi-transparent substrate and a photosensitive, pressure-sensitive layer formed on one side of said substrate, said photosensitive, pressure-sensitive layer consisting essentially of
  (1) microcapsules containing a photocurable resin and a reactant,
  (2) at least one of (a) microcapsules containing a photocurable resin and a coreactant, (b) microcapsules containing a coreactant and (c) a coreactant in fine powder form, wherein all of the coreactants in (a), (b) and (c) are capable of reacting with said reactant to form a colored substance, and
  (3) a wax,
said process comprising
exposing a manuscript and the recording sheet superimposed thereon to a light,
superimposing a plain paper on the recording sheet, and pressing so as to form a transferred image on the plain paper.

7. A process according to claim 6, wherein the step of exposing to light is conducted from the manuscript side.

8. A process according to claim 6, wherein the step of exposing to light is conducted from the recording sheet side.

9. A process according to claim 6, wherein the step of exposing to light is conducted on a superimposed material comprising the manuscript, the plain paper and the recording sheet having a transparent or semi-transparent substrate, said plain paper being superimposed so as to face the coated side of the recording sheet, the light being applied from the substrate side of the recording sheet, followed by pressing.

10. A process according to claim 6, wherein the microcapsules are plural kinds of microcapsules, each containing a different color-forming component and a different photocurable resin or polymerization initiator capable of absorbing light of particular different wavelengths, and the step of exposing to light is conducted by using lights of different wavelengths, each capable of curing only one particular kind of microcapsule, whereby a transferred multicolor image corresponding to the number of color-forming components is formed on the plain paper.

11. The plain paper type transfer imaging system according to claim 1, wherein the reactant is a ligand and the coreactant is a polyvalent metal compound or vice versa.

12. The plain paper type transfer imaging system according to claim 11, wherein the ligand and the polyvalent metal compound are water-soluble chelate-forming substances or oil-soluble chelate-forming substances.

13. The plain paper type transfer imaging system according to claim 11, wherein the ligand is tannic acid, naphthol AS sodium hydroxide, or phthalonitrile and the polyvalent metal compound is ammonium metavanadate, iron alum, stable diazonium salt of 4-benzoamide-2,5-diethoxyaniline or copper sulfate.

14. The plain paper type transfer imaging system according to claim 11, wherein the ligand is protocatechuic acid, ethyl protocatechuate, gallic acid, ethyl gallate, dodecyl gallate, pyrogallol-4-carboxylic acid, pyrogallol tannin or tannic acid, and the polyvalent metal compound is sodium orthovanadate or sodium metavanadate.

15. The plain paper type transfer imaging system according to claim 11, wherein the ligand is zinc o,o-diidopropyldithiophosphate, zinc dimethyldithiocarbamate, N,N'-bis-2-octanoyloxyethyldiethyldithiooxamide, or N-lauroyl-DL-glutamic acid, and the polyvalent metal compound is iron (II) naphthenate iron stearate, copper palmitate or cobalt naphthenate.

16. The plain paper type transfer imaging system according to claim 11, wherein the ligand is n-propyl gallate, n-butyl gallate, n-octyl gallate, 4-tert-butylcatechol, 3,5-di-tert-butylcatechol, 3,6-diisopropyl-catechol, 2,3-dihydroxynaphthalene, 2,3,4-trihydroxyacetophenone, pyrogallol, 2,2'-thiobis(p-cresol), quercetin, tetrachlorocatechol, or tetrabromocatechol, and the polyvalent metal compound is vanadyl acetate, vanadium acetyl acetonate, or vanadyl acetylacetonate.

17. The process for forming a transfer image an a plain paper according to claim 6, wherein the reactant is an electron-donating compound and the coreactant is an electron-accepting compound or vice versa.

18. The process for forming a transfer image an a plain paper according to claim 17, wherein the electron-donating compound is a triarylmethane compound, a diphenylmethane compound, a xanthene compound, a thiazine compound, or a spiro compound, and the electron-accepting compound is an inorganic acidic substance, a substituted phenol compound, a phenolic resin compound, a metal salt-modified phenolic resin compound, an aromatic carboxylic acid compound, a polyvalent metal salt of an aromatic carboxylic acid compound, or a mixture of an aromatic carboxylic acid compound and a polyvalent metal compound.

19. The process for forming a transfer image an a plain paper according to claim 6, wherein the reactant is a ligand and the coreactant is a polyvalent metal compound or vice vera.

20. The process for forming a transfer image an a plain paper according to claim 19, wherein the ligand and the polyvalent metal compound are water-soluble chelate-forming substances or oil-soluble chelate-forming substances.

21. The process for forming a transfer image an a plain paper according to claim 19, wherein the ligand is tannic acid, naphthol AS sodium hydroxide, or phthalonitrile and the polyvalent metal compound is ammonium metavanadate, iron alum, stable diazonium salt of 4-benzoamide-2,5-diethoxyaniline or copper sulfate.

22. The process for forming a transfer image an a plain paper according to claim 19, wherein the ligand is protocatechuic acid, ethyl protocatechuate, gallic acid, ethyl gallate, dodecyl gallate, pyrogallol-4-carboxylic acid, pyrogallol tannin or tannic acid, and the polyvalent metal compound is sodium orthovanadate or sodium metavanadate.

23. The process for forming a transfer image an a plain paper according to claim 19, wherein the ligand is zinc o,o-diidopropyldithiophosphate, zinc dimethyldithiocarbamate, N,N'-bis-2-octanoyloxyethyldiethyldithiooxamide, or N-lauroyl-DL-glutamic acid, and the polyvalent metal compound is iron (II) naphthenate, iron stearate, copper palmitate or cobalt naphthenate.

24. The process for forming a transfer image an a plain paper according to claim 19, wherein the ligand is n-propyl gallate, n-butyl gallate, n-octyl gallate, 4-tert-butylcatechol, 3,5-di-tert-butylcatechol, 3,6-diisopropylcatechol, 2,3-dihydroxynaphthalene, 2,3,4-trihydroxyacetophenone, pyrogallol, 2,2'-thiobis(p-cresol), quercetin, tetrachlorocatechol, or tetrabromocatechol, and the polyvalent metal compound is vanadyl acetate, vanadium acetyl acetonate, or vanadyl acetylacetonate.

* * * * *